(12) United States Patent
Nishimura et al.

(10) Patent No.: US 9,896,760 B2
(45) Date of Patent: Feb. 20, 2018

(54) DEPOSITION APPARATUS

(71) Applicant: CANON ANELVA CORPORATION, Kawasaki-shi, Kanagawa-ken (JP)

(72) Inventors: Hidekazu Nishimura, Hachioji (JP); Naoyuki Nozawa, Inagi (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 189 days.

(21) Appl. No.: 14/932,520

(22) Filed: Nov. 4, 2015

(65) Prior Publication Data

US 2016/0130700 A1 May 12, 2016

(30) Foreign Application Priority Data

Nov. 6, 2014 (JP) ................. 2014-226380

(51) Int. Cl.
| C23C 14/00 | (2006.01) |
| C23C 14/06 | (2006.01) |
| C23C 14/35 | (2006.01) |
| C23C 14/56 | (2006.01) |
| H01J 37/32 | (2006.01) |

(Continued)

(52) U.S. Cl.
CPC .......... *C23C 14/0605* (2013.01); *C23C 14/35* (2013.01); *C23C 14/564* (2013.01); *C23C 14/568* (2013.01); *H01J 37/32055* (2013.01); *H01J 37/32669* (2013.01); *H01J 37/34* (2013.01); *C23C 14/325* (2013.01); *H01J 37/3411* (2013.01)

(58) Field of Classification Search
CPC ............ H01J 37/3411; H01J 37/32055; C23C 14/325
See application file for complete search history.

(56) References Cited

U.S. PATENT DOCUMENTS

| 6,506,292 B2 | 1/2003 | Murakami et al. |
| 2008/0105657 A1* | 5/2008 | Wu .................. H01J 37/32055 |
| | | 219/76.16 |

FOREIGN PATENT DOCUMENTS

| JP | 2002-105628 A | 4/2002 |
| JP | 2005-23407 A | 1/2005 |

(Continued)

OTHER PUBLICATIONS

Office Action dated Aug. 31, 2016, by the Japanese Patent Office in corresponding Japanese Patent Application No. 2014-226380. (2 pages).

*Primary Examiner* — Timon Wanga
(74) *Attorney, Agent, or Firm* — Buchanan Ingersoll & Rooney PC

(57) ABSTRACT

A deposition apparatus comprises a source unit configured to generate a plasma by arc discharge, a deposition unit in which a deposition target material is arranged so as to be irradiated with the plasma generated in the source unit, and an induction unit configured to induce the plasma for the source unit to the deposition unit. The induction unit comprises a partition unit airtightly connected to each of the source unit and the deposition unit and configured to pass the plasma inside, and a plurality of magnet units configured to form a magnetic field to induce the plasma in the partition unit. The plurality of magnet units are connected to adjust a connection angle, and the partition unit includes a tubular member bendable according to the connection angle of the plurality of magnet units.

5 Claims, 10 Drawing Sheets

(51) Int. Cl.
*H01J 37/34* (2006.01)
*C23C 14/32* (2006.01)

(56) References Cited

FOREIGN PATENT DOCUMENTS

WO  WO 96/26531 A2  8/1996
WO  2007/089216 A1  8/2007

\* cited by examiner

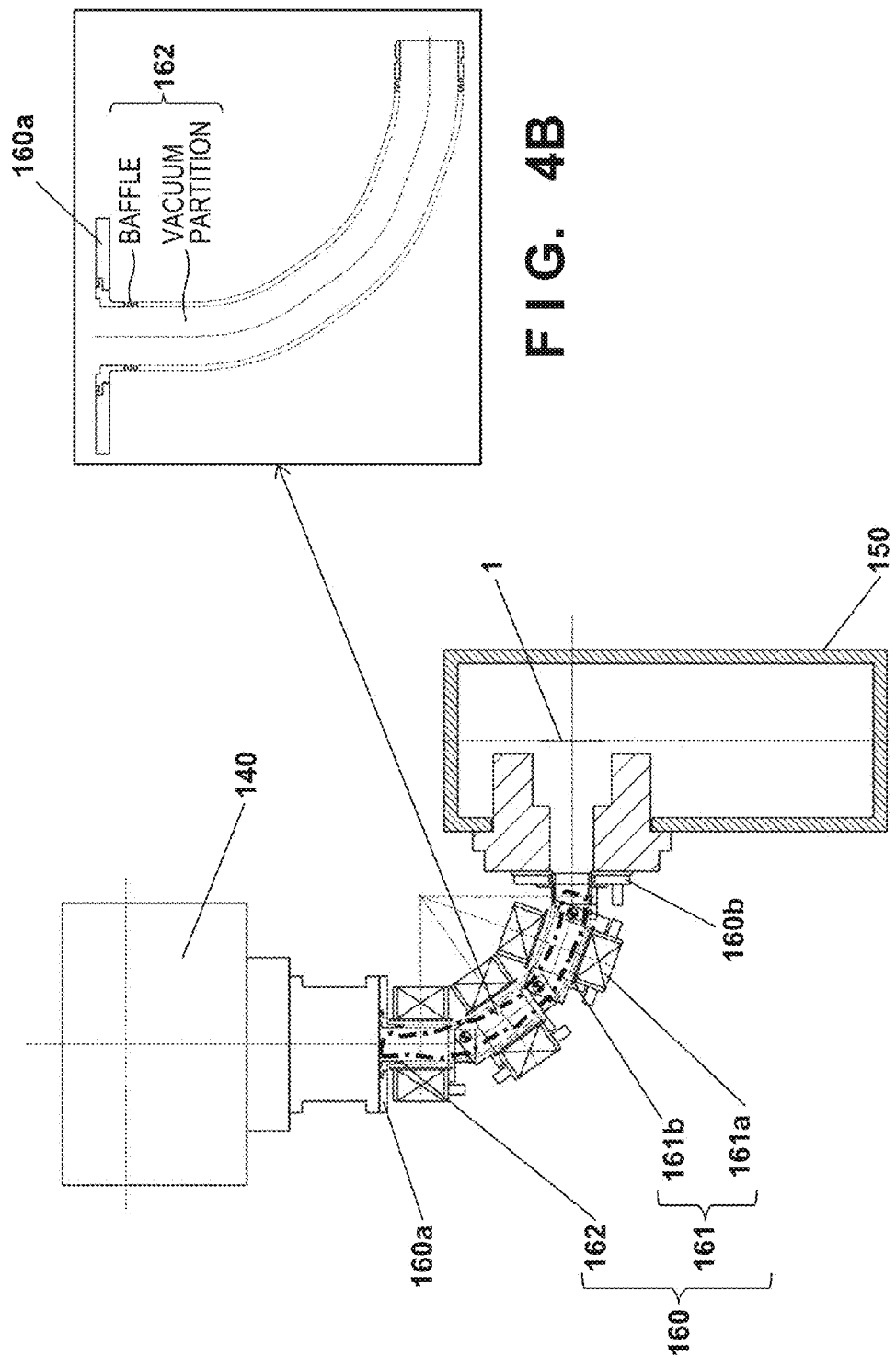

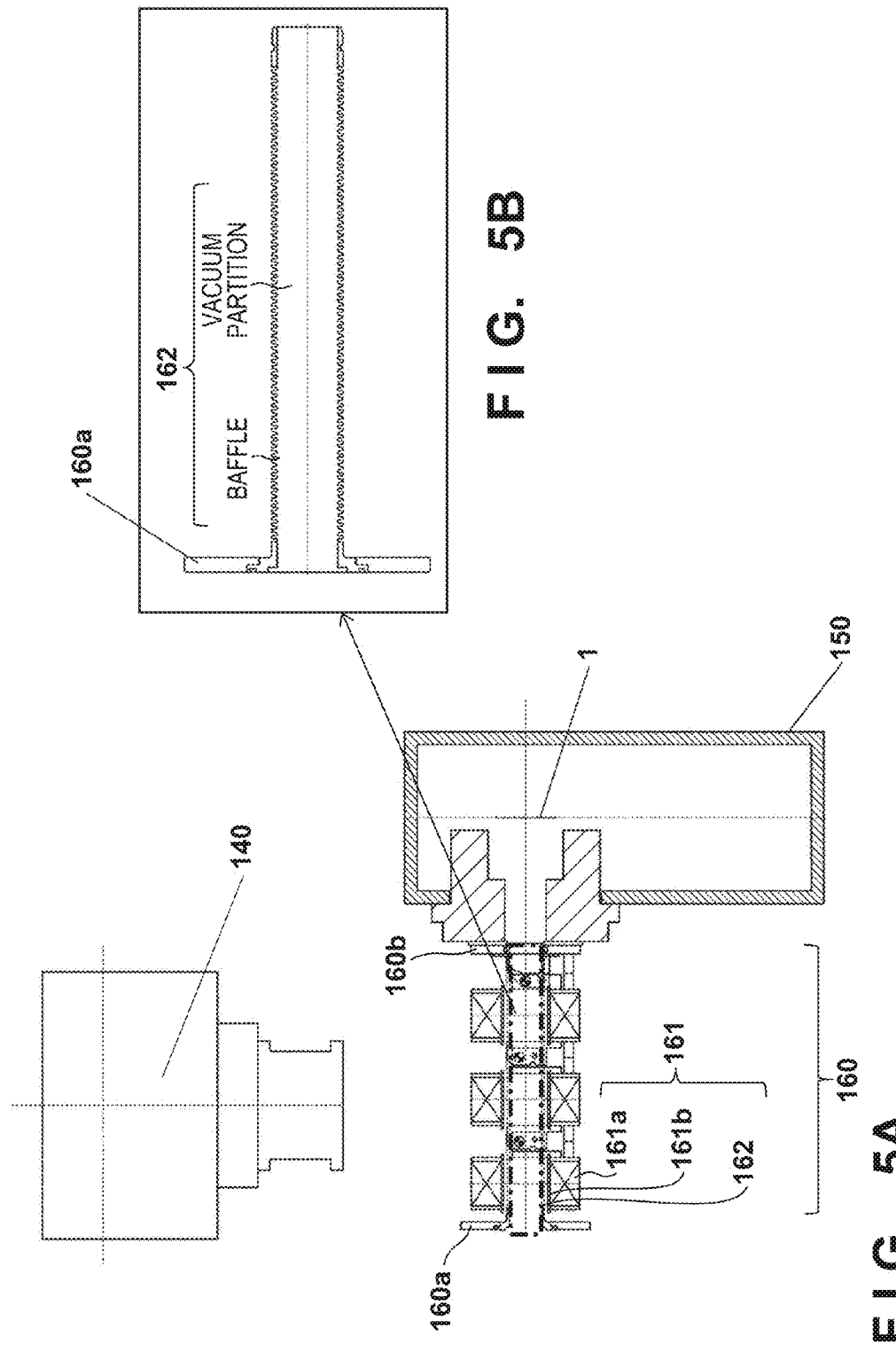

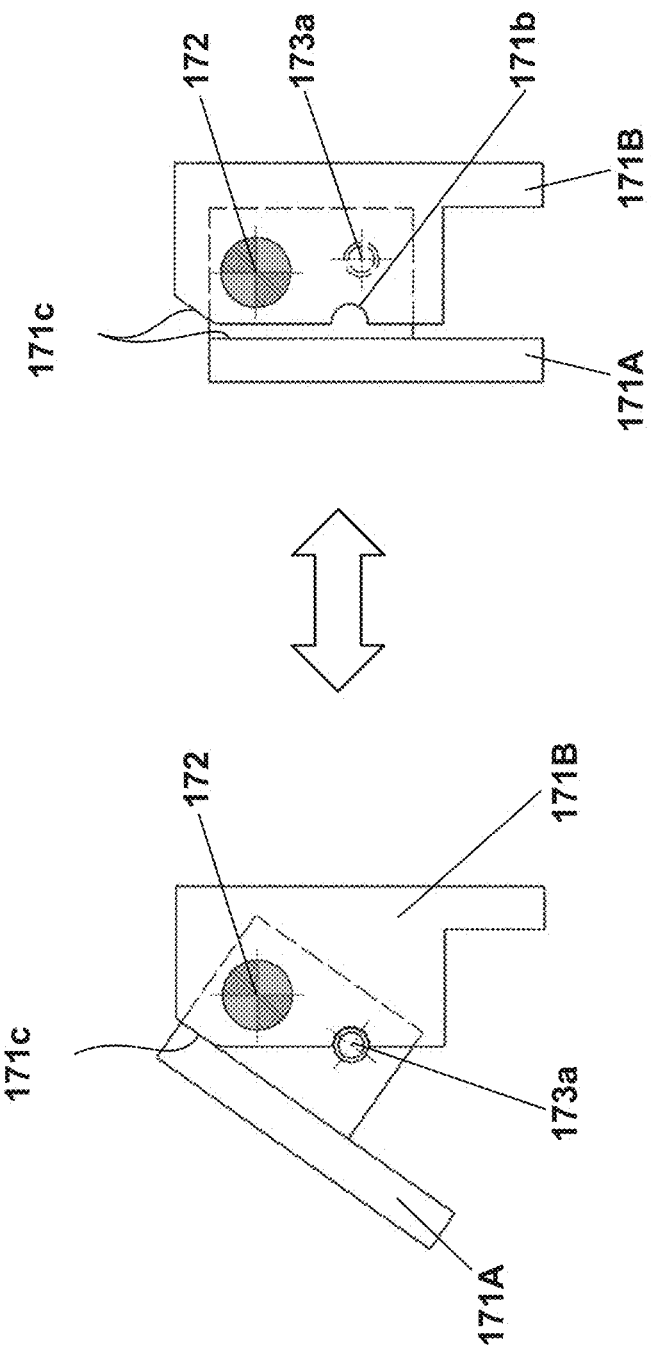

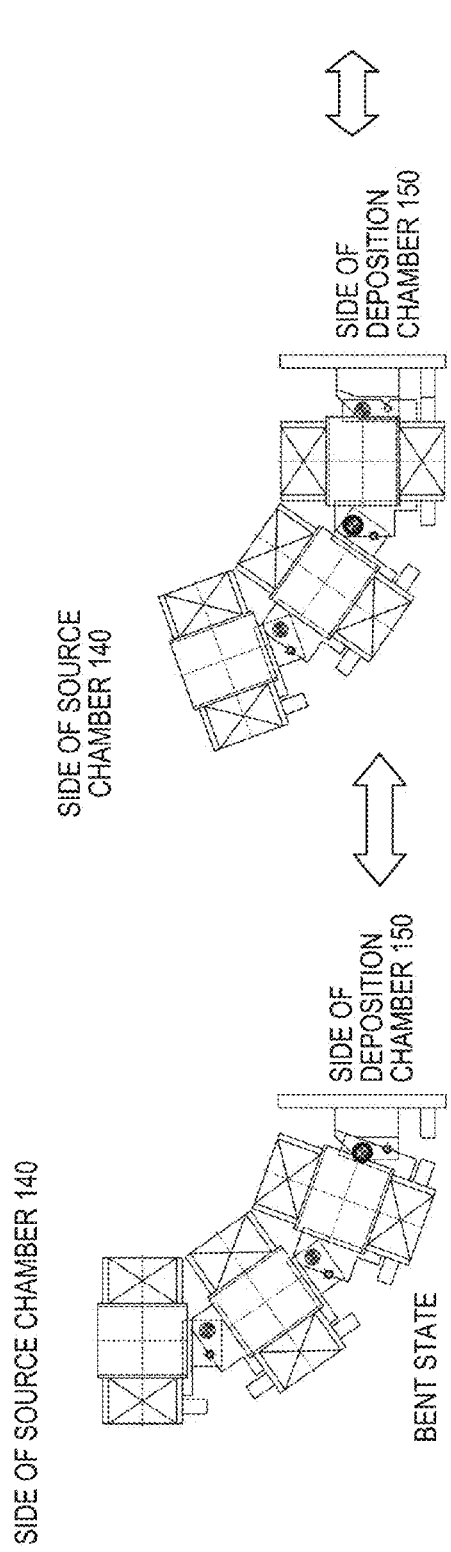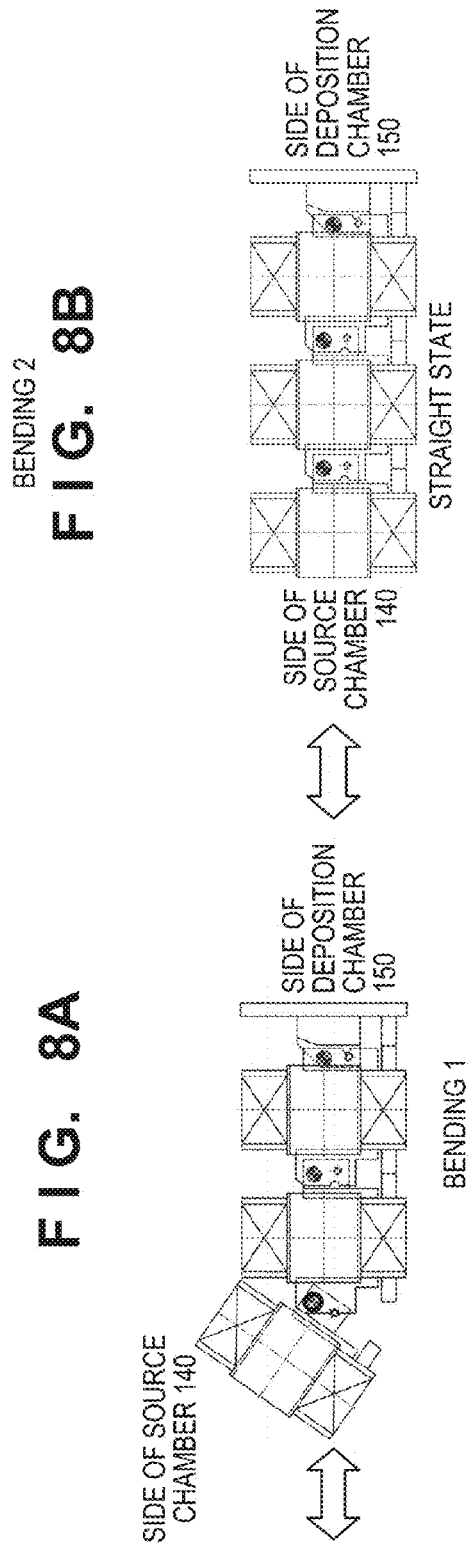

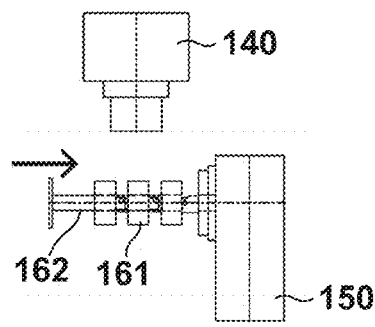
FIG. 9F
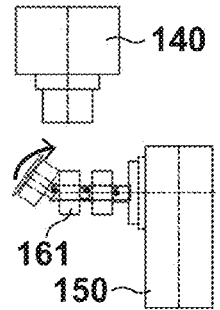
FIG. 9H1
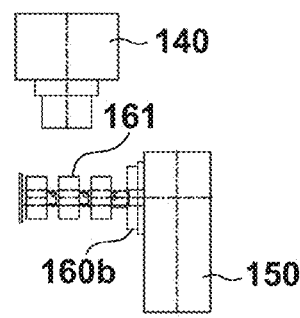
FIG. 9G
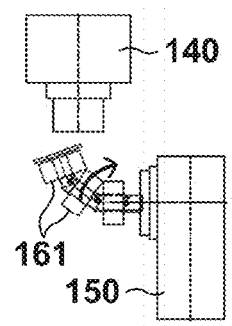
FIG. 9H2
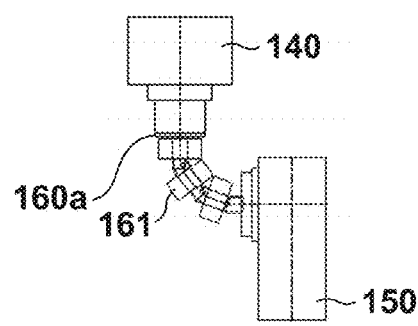
FIG. 9I

DEPOSITION APPARATUS

BACKGROUND OF THE INVENTION

Field of the Invention

The present invention relates to a deposition apparatus for forming a protective film on a substrate.

Description of the Related Art

There is conventionally known a deposition apparatus for forming a protective film made of, for example, ta-C (Tetrahedral Amorphous Carbon) on a substrate. This deposition apparatus includes a filter unit in which the inner wall of a cylindrical electromagnetic coil serves as a vacuum partition, and assembled baffles are fixed on the inner wall of the electromagnetic coil (WO/1996/026531).

Since the filter unit of WO/1996/026531 is formed by assembling a plurality of flanges, the flanges need to be detached when exchanging or cleaning the baffles.

However, the operation of detaching flanges needs cost. In addition, if the positional relationship of electromagnetic coils changes when assembling the flanges, the path of an ion beam may also change, and reproducibility of deposition may be degraded. To prevent this, many man-hours are spent to position the electromagnetic coils.

SUMMARY OF THE INVENTION

The present invention has been made in consideration of the aforementioned problems, and realizes a deposition apparatus that improves the maintainability of the filter unit of the deposition apparatus that forms a protective film on a substrate.

In order to solve the aforementioned problems, the present invention provides a deposition apparatus comprising: a source unit configured to generate a plasma by arc discharge; a deposition unit in which a deposition target material is arranged so as to be irradiated with the plasma generated in the source unit; and an induction unit configured to induce the plasma for the source unit to the deposition unit, wherein the induction unit comprises: a partition unit airtightly connected to each of the source unit and the deposition unit and configured to pass the plasma inside; and a plurality of magnet units configured to form a magnetic field to induce the plasma in the partition unit, the plurality of magnet units are connected to adjust a connection angle, and the partition unit includes a tubular member bendable according to the connection angle of the plurality of magnet units.

According to the present invention, the maintainability of the filter unit improves. More specifically, it is possible to obtain effects of, for example, enabling baffle exchange without moving a source chamber, decreasing leakage risk, and ensuring reproducibility when assembled.

Further features of the present invention will become apparent from the following description of exemplary embodiments (with reference to the attached drawings).

BRIEF DESCRIPTION OF THE DRAWINGS

FIGS. 4A and 4B are schematic views showing the structure of a filter unit when assembled;

FIGS. 5A and 5B are schematic views showing the structure of the filter unit at the time of maintenance;

FIGS. 7A and 7B are enlarged views showing the structure of a hinge mechanism;

FIGS. 8A to 8D are views showing the operation of the hinge mechanisms; and

FIGS. 9A to 9I are schematic views showing the maintenance procedure of the filter unit.

DESCRIPTION OF THE EMBODIMENTS

An embodiment of the present invention will now be described in detail with reference to the accompanying drawings. Note that the present invention is not limited to the embodiment to be described below, and can be modified as needed without departing from the spirit and scope thereof.

Figure 1:
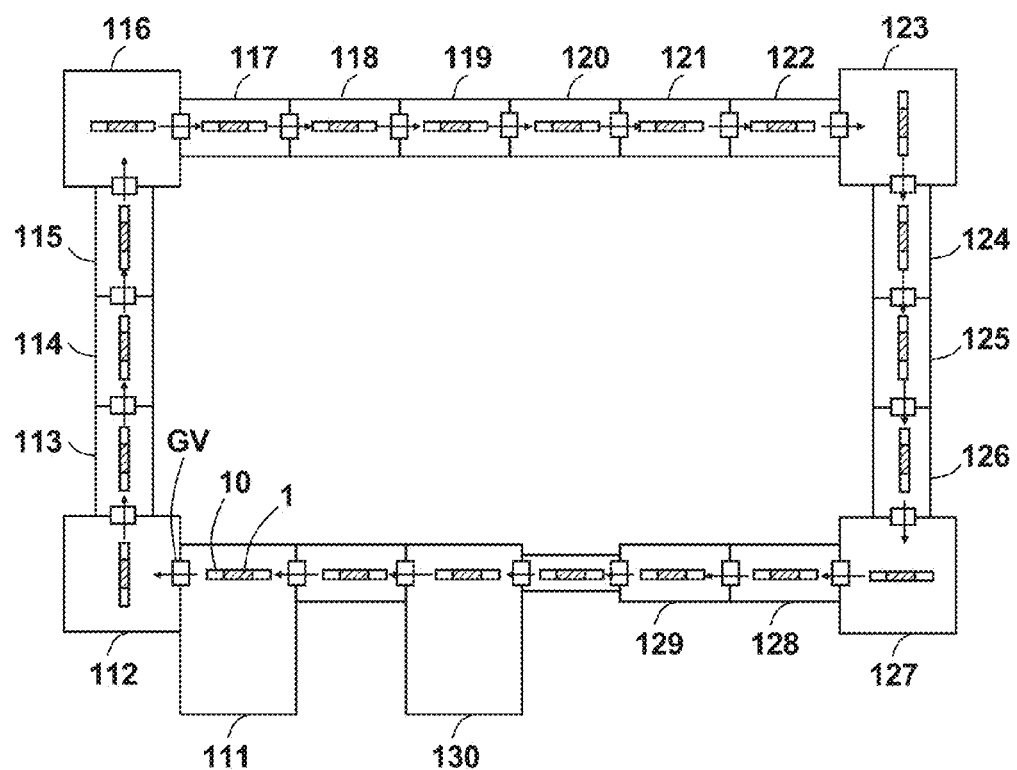
FIG. 1 is a schematic view showing the configuration of a vacuum processing apparatus according to the embodiment.

In this embodiment, a configuration in which a deposition apparatus 128 is connected to an inline type continuous processing apparatus, as shown in FIG. 1, will be described. However, the deposition apparatus 128 may not be incorporated as part of the inline type continuous processing apparatus. In this embodiment, a protective film forming apparatus for forming a protective film on a substrate 1 for, for example, a magnetic disk (platter) of a hard disk drive as a target deposition material will be described. However, the present invention is not limited to this, and may be applied for another application purpose.

[System Configuration]

A vacuum processing apparatus according to this embodiment will be described with reference to FIG. 1.

FIG. 1 is a plan view showing the vacuum processing apparatus according to this embodiment. The vacuum processing apparatus according to this embodiment is an inline type continuous processing apparatus. "Inline type" indicates a manner of an apparatus in which a substrate is transported via a plurality of connected chambers. In the vacuum processing apparatus according to this embodiment, a plurality of chambers 111 to 130 are endlessly connected in a rectangular pattern. Each of the chambers 111 to 130 is a vacuum vessel to be exhausted via a dedicated or shared exhaust system.

The chambers 111 to 130 are connected via gate valves GV. Each of the chambers 111 to 130 is provided with a transport apparatus capable of transporting a carrier 10 via the gate valve GV. The transport apparatus has a transport path to transport the carrier 10 in a vertical orientation. The substrate 1 is placed on the carrier 10 and transported along the transport path (not shown). The chamber 111 is a load lock chamber which places the substrate 1 on the carrier 10. The chamber 130 is an unload lock chamber which collects the substrate 1 from the carrier 10. Note that the substrate 1 is a disc-shaped member made of a metal or glass and having a hole (inner hole portion) at the center.

The chambers 113 to 129 are process chambers configured to perform various kinds of deposition processes on the surface of the substrate 1. More specifically, the chambers include the adhesion layer forming chamber 113 which forms an adhesion layer on the substrate 1, the soft magnetic layer forming chambers 114, 115, and 117 each of which forms a soft magnetic layer on the substrate 1 with the adhesion layer, the seed layer forming chamber 119 which forms a seed layer on the substrate 1 with the soft magnetic layers, the intermediate layer forming chambers 120 and 121 each of which forms an intermediate layer on the substrate 1 with the seed layer, the magnetic film forming chambers 124 and 125 each of which forms a magnetic film on the substrate 1 with the intermediate layers, and the deposition apparatus (protective film forming apparatus) 128 which forms a protective film on the magnetic film. The chambers 112, 116, 123, and 127 located at the corners of the rectangle are direction change chambers each including a direction change mechanism for changing the transport direction of the substrate 1 by 90°.

The chambers 113 to 115, 117, 119 to 121, 124, and 125 deposit the adhesion layer, the soft magnetic layers, the seed layer, the intermediate layers, and the magnetic recording layers on the substrate 1 by a DC magnetron sputtering process. The forming chambers basically have the same structure except the target material. The structure of the magnetic film forming chamber 124 will be exemplified below.

The magnetic film forming chamber 124 includes an exhaust system, a gas introduction system that introduces a process gas, a target provided with its sputtered surface exposed to the internal space, a power supply that applies a discharge voltage to a cathode electrode (target), and a magnet device provided behind the target. The magnetic film forming chamber 124 has a bilaterally symmetrical structure with respect to the carrier 10 (substrate 1), and can simultaneously deposit films on both surfaces of the substrate 1 held on the carrier 10. While introducing a process gas, the exhaust system keeps the interior of the magnetic film forming chamber 124 at a predetermined pressure. In this state, the power supply applies power. As a result, discharge occurs, and the target is sputtered. The sputtered target material reaches the substrate 1, and a predetermined magnetic film is formed on the surface of the substrate 1. Note that FIG. 1 also illustrates process chambers that have not been described above. These process chambers are a substrate cooling chamber that cools the substrate 1, and a substrate holding change chamber that changes the holding position of the substrate.

The carrier 10 can hold two substrates 1 simultaneously. The carrier 10 includes a holder that is made of an Ni alloy and holds a substrate, and a slider that supports the holder and moves on the transport path. The carrier 10 can move on the transport path in a vertical orientation. A plurality of members (leaf springs) provided on the holder can hold several portions of the peripheral portion of the substrate 1. For this reason, the substrate 1 can be held in an orientation with its deposition surface facing the target without being blocked.

The transport apparatus (not shown) includes a plurality of driven rollers arranged along the transport path, and a magnetic screw that introduces power to the vacuum side by magnetic coupling. The slider of the carrier 10 includes a permanent magnet. The permanent magnet of the slider and the rotating magnetic screw are magnetically coupled, thereby moving the slider (carrier 10) along the driven rollers.

The processing procedure of the substrate 1 in the vacuum processing apparatus will be described here.

First, two unprocessed substrates 1 are placed on the first carrier 10 in the load lock chamber 111. The carrier 10 moves the adhesion layer forming chamber 113, and an adhesion layer is formed on each substrate 1. At this time, an operation of placing two unprocessed substrates 1 on the next carrier 10 is performed. After the elapse of 1 tact time, the carrier 10 moves to the soft magnetic layer forming chamber 114, and a soft magnetic layer is formed on each substrate 1. At this time, the next carrier 10 moves the adhesion layer forming chamber 113, and an adhesion layer is formed on each substrate 1. In the load lock chamber 111, the operation of placing the substrates 1 on the carrier 10 after next is performed.

In this way, the carrier 10 is transported to an adjacent chamber every tact time, and formation of the adhesion layer, the soft magnetic layers, the seed layer, the intermediate layers, the magnetic recording layers, and the protective film is sequentially performed. The adhesion layer is deposited in the adhesion layer forming chamber 113, the soft magnetic layers are deposited in the soft magnetic layer forming chambers 114, 115, and 117, the seed layer is deposited in the seed layer forming chamber 119, the intermediate layers are deposited in the intermediate layer forming chambers 120 and 121, and the magnetic recording layers are deposited in the magnetic film forming chambers 124 and 125 by the DC magnetron sputtering process. The protective film is, for example, a ta-C film, and is deposited in the deposition apparatus 128 by a CVD process. After the deposition processing, the carrier 10 reaches the unload lock chamber 130, and an operation of collecting the two processed substrates 1 from the carrier 10 is performed.

[Apparatus Configuration]

The deposition apparatus 128 according to this embodiment will be described next with reference to FIG. 2.

Figure 2:
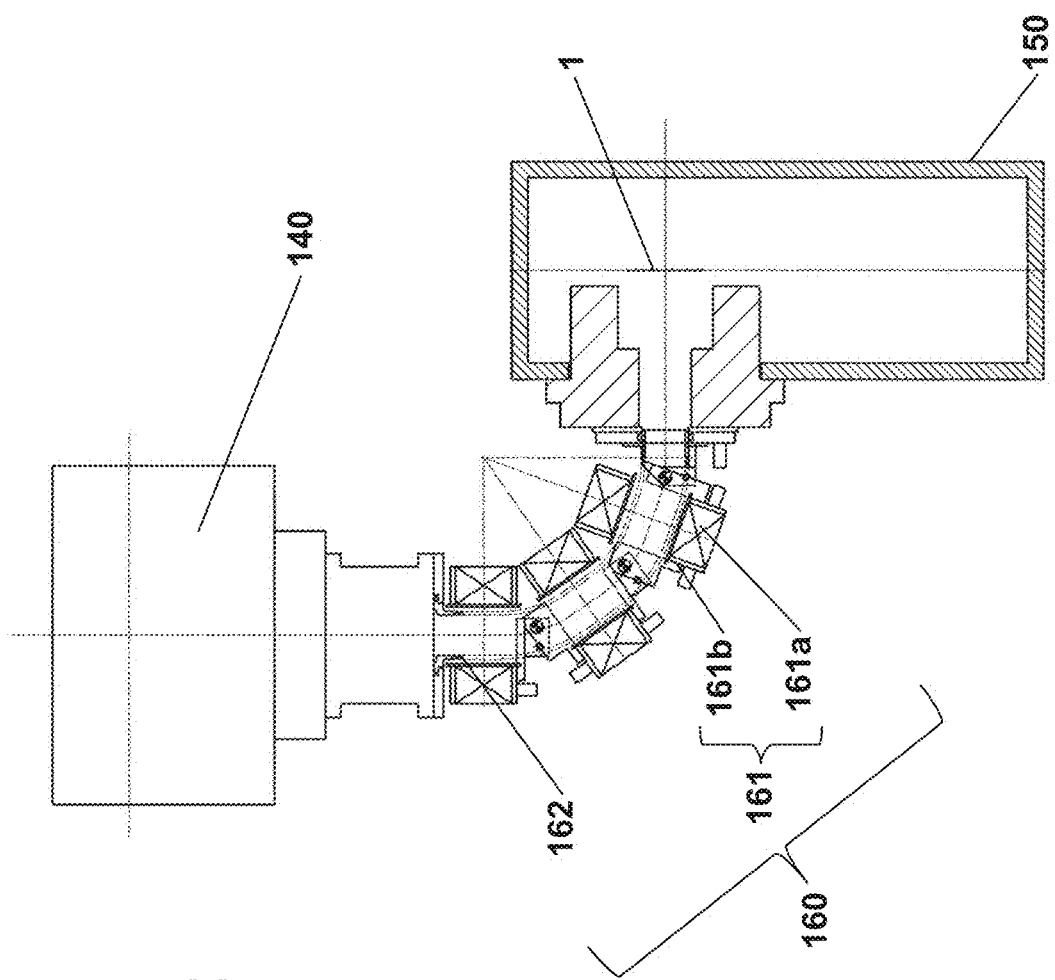
FIG. 2 is a schematic sectional view of a deposition apparatus according to the embodiment.

FIG. 2 is a schematic sectional view of the deposition apparatus 128 viewed from the moving direction of the carrier 10. The deposition apparatus 128 includes a source chamber (source unit) 140 that generates a plasma by arc discharge, a deposition chamber (deposition unit) 150 in which the substrate 1 is arranged to be irradiated with the plasma generated in the source chamber 140, and a filter unit (induction unit) 160 that induces the plasma from the source chamber 140 to the deposition chamber 150. The source chamber 140 and the filter unit 160 are provided on each of the left and right sides of the deposition chamber 150. FIG. 2 illustrates only one side for convenience.

A vacuum partition unit 162 is inserted into the filter unit 160. The source chamber (source unit) 140 is a vacuum vessel connected to the exhaust system, and deposition can be done simultaneously on both surfaces of the two substrates 1 held on the carrier 10. The substrates 1 are held on the carrier 10 that is moved in the deposition chamber 150 by the above-described transport apparatus. The deposition apparatus 128 has a horizontally symmetrical structure with respect to the carrier 10 (substrate 1) at a predetermined position. When performing deposition on the substrate 1, the substrate 1 is held via the carrier 10 at a predetermined position in the center of the deposition chamber 150 by the transport apparatus.

The both ends of the filter unit 160 are connected to the source chamber 140 and the deposition chamber 150. Note that details of the filter unit (induction unit) 160 will be described later with reference to FIGS. 4A and 4B.

Figure 3:
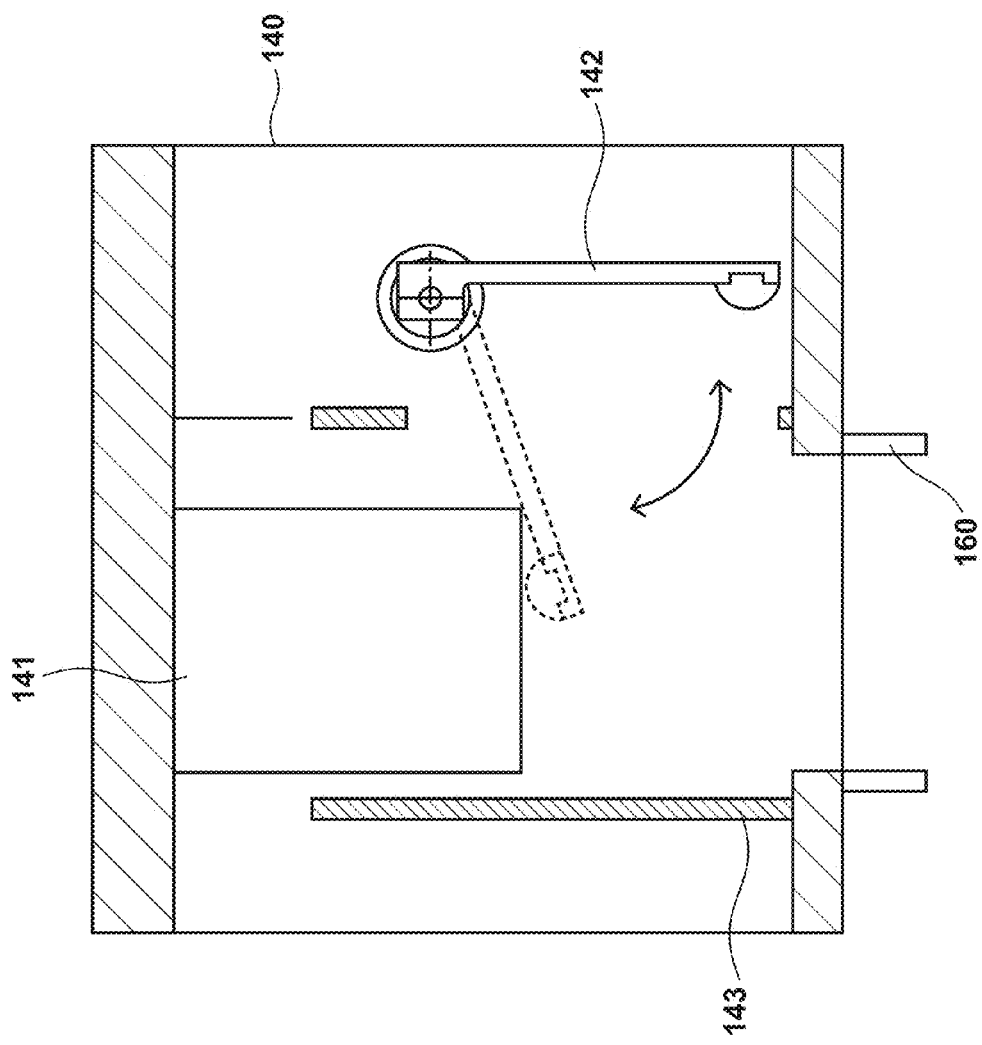
FIG. 3 is a schematic view showing the configuration of the source chamber of the deposition apparatus according to the embodiment.

FIG. 3 schematically shows the configuration of the source chamber 140. To generate a plasma by arc discharge, the source chamber 140 incorporates a carbon target 141, a striker 142, and an anode 143. When the striker 142 is brought into contact with the surface of the carbon target 141 in a state in which a voltage is applied from the anode 143 to the target 141, arc discharge occurs between the anode 143 and the target 141. The arc discharge generates ions of the target material. Since the target 141 according to this embodiment is carbon, carbon ions are generated. The ions are guided to the substrate 1 via the filter unit 160.

FIGS. 4A and 4B and 5A and 5B schematically show the structure of the filter unit 160. The filter unit (induction unit) 160 has the function of a guide path that guides the carbon ions generated in the source chamber 140 to the substrate 1 placed in the deposition chamber 150. The carbon ions generated by arc discharge are attracted by electrons. When the electrons move along lines of magnetic force generated by a magnet unit 161, the carbon ions are transported in the filter unit 160. The filter unit 160 includes a plurality of magnet units 161 that generate a magnetic force, and the partition unit (a vacuum partition and baffles) 162 that connects the source chamber 140 and the deposition chamber 150.

The partition unit 162 is a tubular member made of a metal and having the composite function of a vacuum partition serving as a guide path and baffles. Fold structures serving as baffles are formed at equal intervals on the inner wall of the vacuum partition. The baffles can be formed as components separate from the vacuum partition and attached to the inner surface of the vacuum partition to form a double structure. The vacuum partition of the partition unit has a flexible deformable structure and is formed as a member separate from the magnet unit 161 (an electromagnetic coil 161a and a metal tube 161b). The partition unit 162 can be arranged to be inserted in the metal tube 161b on which the lead of the electromagnetic coil 161a is wound.

A baffle is a disc-shaped metal member having a structure configured to chuck droplets in the plasma generated in the source chamber 140 and block influent particles to the substrate 1. A plurality of baffles are arranged like bellows to form folds on the inner wall of the vacuum partition that is the guide path for airtightly connecting the source chamber 140 and the deposition chamber 150. Since the baffles are placed in the tubular guide path, their inner diameter is adjusted in advance so as to remove droplets and particles while passing an effective beam portion necessary for deposition. Since the droplets reach the substrate 1 after being repetitively reflected by the inner wall, baffles with grooves or tilted baffles are used.

Each magnet unit 161 is formed by winding the electromagnetic coil 161a around the metal tube 161b. The plurality of metal tubes 161b are connected by a hinge mechanism to be described later. In this embodiment, three magnet units 161 are provided. The plurality of magnets connected to be a long-length are also called a magnet group.

The metal tube 161b is a tubular member made of a metal on which the lead of the electromagnetic coil 161a is wound, and has the function of a bobbin.

The electromagnetic coil 161a has a structure to generate lines of magnetic force to transport carbon ions. A current is supplied to the coil to generate a magnetic field, thereby generating lines of magnetic force in the axial direction of the metal tube 161b on which the electromagnetic coil 161a is wound. When electrons move along the generated lines of magnetic force, carbon ions generated in the source chamber 140 are transported to the deposition chamber 150 in which the substrate 1 is placed.

FIGS. 4A and 4B show the state of the filter unit 160 when assembled. The filter unit 160 is connected to the source chamber 140 and the deposition chamber 150 by flange units 160a and 160b. More specifically, as shown in FIG. 4B, the partition unit 162 is arranged in the metal tubes 161b of the magnet units 161 and bends conforming to the magnet units 161. The both ends of the partition unit 162 are airtightly connected to the source chamber 140 and the deposition chamber 150 by the flange units 160a and 160b, respectively.

FIGS. 5A and 5B show the state of the filter unit 160 at the time of maintenance. The filter unit 160 is detached from the source chamber 140. In a state in which the plurality of magnet units 161 are stretched straight, as shown in FIG. 5A, the partition unit 162 in the magnet units 161 also changes to a straight state, as shown in FIG. 5B. If the partition unit 162 and the deposition chamber 150 are unfastened in this state, only the partition unit 162 can be detached.

Figure 6A:
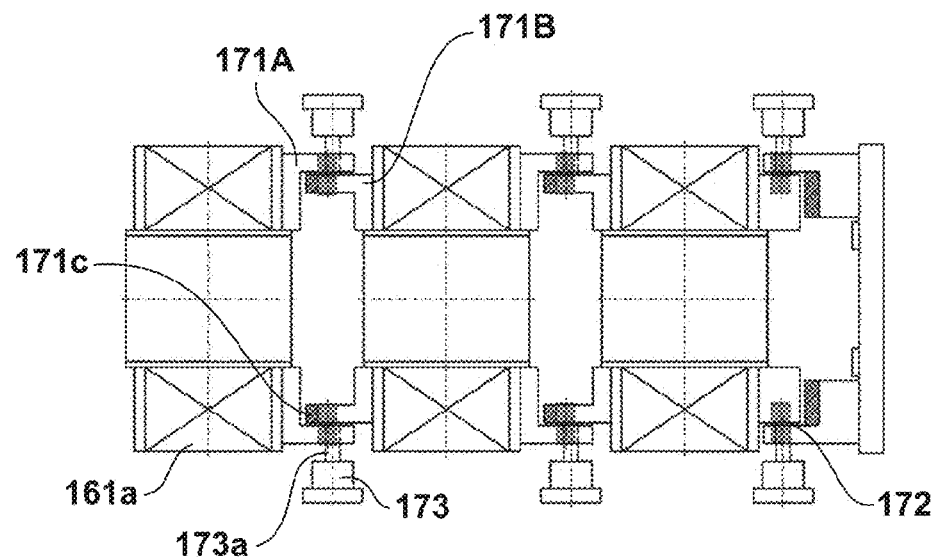
FIGS. 6A and 6B are enlarged views of magnet units.
Figure 6B:
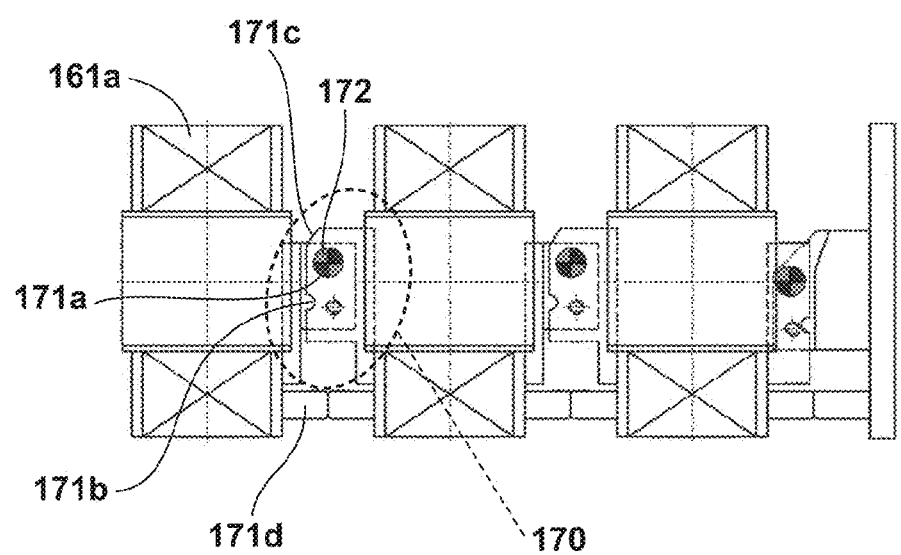

FIGS. 6A and 6B are enlarged plan and sectional views, respectively, showing the magnet units 161 stretched straight, as shown in FIGS. 5A and 5B. FIGS. 7A and 7B are enlarged views of a hinge mechanism in a bent state and a straight state. FIGS. 8A to 8D show the operation of the hinge mechanisms when deforming from the bent state to the straight state or from the straight state to the bent state.

The magnet units 161 are formed by connecting the plurality of electromagnetic coils 161a in series via hinge mechanisms 170. Note that in the drawings, the magnet group includes three magnet units 161. However, the number of magnet units is not limited to three. If two or more magnet units exist, the present invention can be applied.

The hinge mechanism 170 includes a pair of hinge blocks 171A and 171B, a rotation shaft 172, and a plunger 173.

The hinge blocks 171A and 171B are base members provided at both ends of each metal tube 161b in the connection direction to connect the adjacent electromagnetic coils 161a. The hinge blocks 171A and 171B include holes 171a for the rotation shaft, a tap 171b for fixing the plunger, and butt surfaces 171c that decide the rotation angle. The hinge blocks 171A and 171B and the butt surfaces 171c form a first stopper that adjusts the magnet group to a predetermined angle.

The rotation shaft 172 connects the metal tubes 161b of the adjacent magnet units 161. With respect to the rotation shaft 172 of the hinge blocks 171A and 171B as the center, the filter unit 160 can be changed to a first state in which the filter unit is bent by 90° and a second state in which the filter unit is stretched straight.

The plunger 173 has a function of allowing the magnet group to keep the position at a predetermined angle and hold a first state in which the magnet group as the filter unit 160 is bent by 90°.

The butt surfaces 171c are contact surfaces provided on the hinge blocks 171A and 171B to prevent the magnet units 161 from rotating more than necessary. By adjusting the tilt angles of the butt surfaces 171c, the rotation angle of each connected magnet unit 161 can be decided in a state in which the filter unit 160 is bent by 90°.

The plunger pin 173a is provided at the distal end of the plunger 173. When the hinge blocks 171A and 171B come into contact with each other on the butt surfaces 171c, the plunger pin 173a engages with the hole 171b for the plunger pin, which has a semicircular sectional shape and is formed in an end face of the hinge block 171B, thereby holding the first state in which the filter unit 160 is bent by 90°.

A pair of mechanical stoppers (second stoppers) 171d are provided at both ends of the electromagnetic coil 161a of each magnet unit 161 in the connection direction to hold the magnet units 161 horizontally in the second state in which the adjacent magnet units 161 are stretched straight.

The advantage of the structure capable of separating the magnet units 161 and the partition unit 162 will be described here.

In the maintenance operation of the filter unit 160, it is necessary to clean particles adhered to the surfaces (folds on the inner surface of the partition unit 162) of the baffles placed in the filter unit 160 and droplets collected between the baffles, and exchange the baffles. That is, in the maintenance operation of the filter unit 160, it is necessary to access the baffles to clean them. The operation can be facilitated by detaching the partition unit 162 from the magnet units 161.

In the deposition apparatus 128 according to this embodiment, the magnet units 161 (magnet group) and the partition unit 162 are divided to be separable. More specifically, the plurality of magnet units 161 are connected via the hinge mechanisms 170 so as to adjust the connection angles between them. More specifically, to change from the bent state shown in FIG. 8A to the straight state shown in FIG. 8D, the plurality of magnet units 161 can be stretched sequentially from the side of the deposition chamber 150 (FIG. 8B). Conversely, to change from the straight state shown in FIG. 8D to the bent state shown in FIG. 8A, the plurality of magnet units 161 can be bent sequentially from the side of the source chamber 140 (FIG. 8C). In this way, the filter unit 160 can be deformed between the first state (bent state) in which its guide path is bent by 90° and the second state (straight state) in which the guide path is stretched straight.

In addition, the flexible tubular member (partition unit 162) is given the functions of a vacuum partition and baffles and inserted into the hollow interior of the tubular electromagnetic coils 161a. With this structure, when the filter unit 160 is changed to the straight state, the internal partition unit 162 also changes to the straight state. This facilitates insertion and removal of the annular members of the partition unit 162 upon assembling or maintenance.

As described above, the partition unit 162 has a flexible deformable structure, and the plurality of magnet units 161 (magnet group) are connected via the hinge mechanisms 170 so as to adjust the positional relationship between the electromagnetic coils. This makes it possible to do a maintenance operation such as exchange of the partition unit 162 without moving the source chamber 140 by moving the electromagnetic coils 161a of the plurality of magnet units 161.

Furthermore, since the partition unit 162 can be detached only by removing the both ends (two portions) of the partition unit 162, the risk of a gas leak can be reduced. That is, in this embodiment, the inserted partition unit 162 is connected at two portions of its both ends regardless of the number of connected electromagnetic coils 161a. Since portions where a gas leak may occur are limited to the two portions, the risk of a gas leak is consequently reduced.

Moreover, since the butt surfaces 171c and the plunger 173 are prepared on the hinge blocks 171A and 171B to enable fixing at the same positions in every assembling, reproducibility when assembled can be ensured.

[Maintenance Procedure]

The maintenance procedure of the filter unit 160 will be described next with reference to FIGS. 9A to 9I.

Figure 9A:
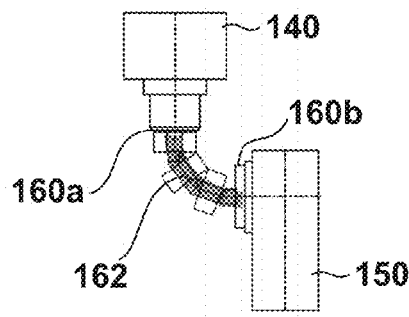

FIG. 9A shows a step of detaching the flange unit 160a at one end of the partition unit 162 from the source chamber 140.

Figure 9D:
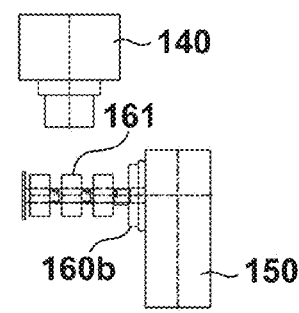
Figure 9B:
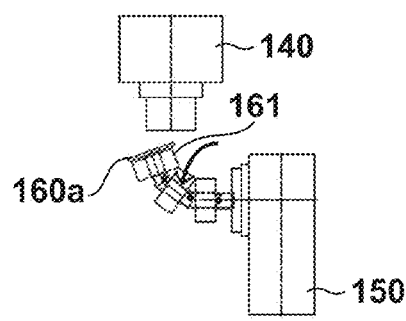

FIG. 9B shows a step of stretching the plurality of magnet units 161 connected via the hinge mechanisms 170 sequentially from the side of the deposition chamber 150, and stretching the partition unit 162 to the straight state. In the filter unit 160, by stretching the magnet units from the side of the deposition chamber 150, the flange unit 160a can be detached without moving the source chamber 140 because the partition unit 162 is flexible.

Figure 9E:
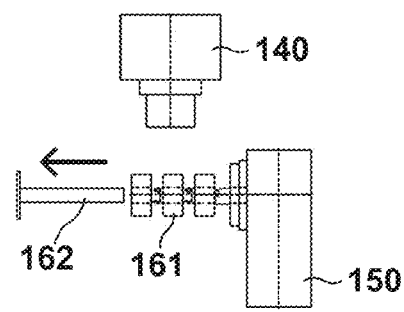
Figure 9C:
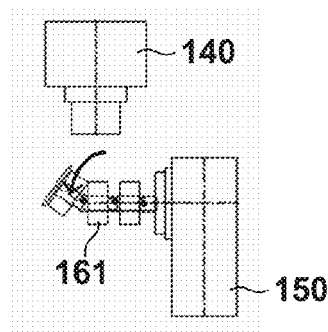

FIG. 9C shows a state in which the magnet units 161 stretched to the straight state hold the horizontal state by the mechanical stoppers (second stoppers) 171d.

FIG. 9D shows a step of cleaning droplets collected in the baffles of the partition unit 162. The flange unit 160b at the other end of the partition unit 162 is detached for the side of the deposition chamber 150.

FIG. 9E shows a step of removing the partition unit 162 from the magnet units 161 (magnet group). The interior of the partition unit 162 is cleaned/reproduced (droplets and particles collected inside are removed).

FIG. 9F shows a step of inserting the cleaned/washed partition unit 162 or an exchanged new partition unit 162 into the magnet units 161.

FIG. 9G shows a step of connecting the flange unit 160b at the other end of the partition unit 162 inserted into the magnet units 161 to the deposition chamber 150.

FIGS. 9H1 and 9H2 show a step of bending the magnet units 161 sequentially from the side of the source chamber 140. The bending angle is determined in advance by the tilt angle of the butt surfaces (first stopper) 171c of the hinge blocks 171A and 171B and fixed by the plunger 173.

FIG. 9I shows a step of connecting the flange unit 160a at one end of the partition unit 162 to the source chamber 140. The maintenance operation is thus completed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-226380, filed Nov. 6, 2014, which is hereby incorporated by reference herein in its entirety.

What is claimed is:

1. A deposition apparatus comprising:
   a source unit configured to generate a plasma by arc discharge;
   a deposition unit in which a deposition target material is arranged so as to be irradiated with the plasma generated in the source unit; and
   an induction unit configured to induce the plasma for the source unit to the deposition unit,
   wherein the induction unit comprises:
   a partition unit airtightly connected to each of the source unit and the deposition unit and configured to pass the plasma inside; and
   a plurality of magnet units configured to form a magnetic field to induce the plasma in the partition unit,
   the plurality of magnet units are flexibly connected with a hinge mechanism to adjust a connection angle, and
   the partition unit includes a tubular member bendable according to the connection angle of the plurality of magnet units.

2. The apparatus according to claim 1, wherein the plurality of magnet units is deformable, by adjusting the connection angle using the hinge mechanism, to a first state in which the partition unit is bent to induce the plasma from the source unit to the deposition unit and a second state in which the partition unit is stretched straight to detach the partition unit from the plurality of magnet units.

3. The apparatus according to claim 2, wherein the hinge mechanism includes hinge blocks and a rotation shaft configured to connect the plurality of magnet units, a first stopper configured to hold the plurality of magnet units in the first state, and a second stopper configured to hold the plurality of magnet units in the second state.

4. The apparatus according to claim 1, wherein each of the magnet units comprises a metal tube, and an electromagnetic coil wound around the metal tube, and the induction unit formed by connecting the plurality of magnet units has a flange unit at one end connected to the source unit and a flange unit at the other end connected to the deposition unit.

5. The apparatus according to claim 1, wherein the partition unit further comprises a baffle provided in the tubular member and configured to remove particles in the plasma.

* * * * *